US011369039B2

US 11,369,039 B2

(12) United States Patent
Dailey

(10) Patent No.: US 11,369,039 B2
(45) Date of Patent: Jun. 21, 2022

(54) METHODS AND SYSTEMS FOR OPERATING A LIGHTING DEVICE

(71) Applicant: Phoseon Technology, Inc., Hillsboro, OR (US)

(72) Inventor: Collin Dailey, Portland, OR (US)

(73) Assignee: Phoseon Technology, Inc., Hillsboro, OR (US)

(*) Notice: Subject to any disclaimer, the term of this patent is extended or adjusted under 35 U.S.C. 154(b) by 427 days.

(21) Appl. No.: 16/686,043

(22) Filed: Nov. 15, 2019

(65) Prior Publication Data
US 2021/0153383 A1 May 20, 2021

(51) Int. Cl.
*H05K 7/20* (2006.01)
*G06F 1/20* (2006.01)

(52) U.S. Cl.
CPC ......... *H05K 7/20209* (2013.01); *G06F 1/206* (2013.01); *H05K 7/20154* (2013.01); *H05K 7/20172* (2013.01)

(58) Field of Classification Search
CPC ........... H05K 7/20209; H05K 7/20154; H05K 7/20172; G06F 1/206
See application file for complete search history.

(56) References Cited

U.S. PATENT DOCUMENTS

| 5,664,995 | A | 9/1997 | O'Keefe |
| 5,963,887 | A | 10/1999 | Giorgio |
| 6,188,189 | B1 | 2/2001 | Blake |
| 6,194,858 | B1 | 2/2001 | Chen |
| 6,881,142 | B1 | 4/2005 | Nair |
| 6,935,130 | B2 | 8/2005 | Cheng et al. |
| 10,638,639 | B1* | 4/2020 | Garner ................ F28D 15/0266 |
| 2005/0151553 | A1* | 7/2005 | Kabbani ............ G01R 31/2891 |
| | | | 324/750.08 |
| 2008/0306635 | A1 | 12/2008 | Rozzi |
| 2011/0014061 | A1 | 1/2011 | Hopkins et al. |
| 2016/0282916 | A1* | 9/2016 | Shabbir ................... G06F 1/206 |

FOREIGN PATENT DOCUMENTS

| CN | 105491852 A | * | 4/2016 | |
| JP | 2006202898 A | * | 8/2006 | ......... G05D 23/1913 |

* cited by examiner

*Primary Examiner* — Mark A Connolly
(74) *Attorney, Agent, or Firm* — McCoy Russell LLP

(57) ABSTRACT

Methods and systems for operating a lighting device are provided. In one example, a method of operating a lighting device including an array of light-emitting elements, an array of heat sinks, and an array of cooling fans, wherein each of the heat sinks corresponds to one of the light-emitting elements, and each of the cooling fans corresponds to one of the heat sinks, includes conductively coupling each of the heat sinks to the corresponding light-emitting element, directing air flow from each of the cooling fans to the corresponding heat sink, measuring heat sink temperatures corresponding to each of the heat sinks with a temperature sensor positioned at the heat sinks, adjusting a speed of each of the cooling fans to reduce a deviation of the corresponding heat sink temperature from a target temperature, and adjusting the target temperature based on an aggregate characteristic of the cooling fan speeds.

20 Claims, 8 Drawing Sheets

FIG. 7

Table of aggregate characterisics 710

| Symbol | Description |
|---|---|
| $\max(V_i)$, $\min(V_i)$ | Module fan speeds; maximum and minimum fan speeds |
| $\max(T_i)$, $\min(T_i)$ | Module heat sink temperatures; maximum and minimum heat sink temperatures |
| $\sigma(T_i)$ | Standard deviation (or variance) of heat sink temperatures |
| $\sigma(V_i)$ | Standard deviation (or variance) of fan speeds |
| $\mu(T_i)$ | Mean heat sink temperature |
| $\mu(V_i)$ | Mean fan speed |
| $\mu(T_i - T_{target})$ | Mean deviation of heat sink temperature from target temperature |
| $\max(T_i - T_{target})$, $\min(T_i - T_{target})$ | Deviation of heat sink temperature from target temperature; maximum and minimum temperature deviations |
| $\text{count}(T_i > T_{TH})$ | Number of heat sinks with temperatures greater than a threshold temperature |

Table of aggregate characteristic control condition and control actions 720

| | $t_{elapsed}$ | Aggregate characteristic control condition | Control action |
|---|---|---|---|
| 1 | < $t_{th}$ | $\text{count}(T_i > T_{TH,upper}) > 0$ | Increase $T_{target}$ by $\Delta T_{TH}$ |
| 2 | > $t_{th}$ | $\max(V_i) > V_{TH,upper}$ | Maintain $T_{target}$; Decrease $t_{TH}$ |
| 3 | > $t_{th}$ | $\sigma(T_i) > \sigma(T_i)_{TH,upper}$ | Increase $T_{target}$ by $\Delta T_{TH}$ |
| 4 | > $t_{th}$ | $\sigma(T_i) < \sigma(T_i)_{TH,lower}$ | Decrease $T_{target}$ by $\Delta T_{TH}$ |
| 5 | > $t_{th}$ | $\min(V_i) < V_{TH,lower}$ | Decrease $T_{target}$ by $\Delta T_{TH}$ |
| 6 | > $t_{th}$ | $\max(T_i) > T_{TH,upper}$ | Increase $T_{target}$ by $\Delta T_{TH}$ |
| 7 | > $t_{th}$ | $T_{TH,upper} > \max(T_i) > T_{TH,lower}$ | Maintain $T_{target}$ |
| 8 | > $t_{th}$ | $\mu(T_i - T_{target}) > \mu(T_i - T_{target})_{TH,upper}$ | Increase $T_{target}$ by $\Delta T_{TH}$; Increase $\Delta T_{TH}$; Decrease $t_{TH}$ |
| 9 | > $t_{th}$ | $\mu(V_i) > \mu(V_i)_{TH,upper}$ | Increase $T_{target}$ by $\Delta T_{TH}$ |
| 10 | > $t_{th}$ | $\mu(T_i - T_{target}) < \mu(T_i - T_{target})_{TH,lower}$ | Decrease $T_{target}$ by $\Delta T_{TH}$; Decrease $\Delta T_{TH}$; Increase $t_{TH}$ |

METHODS AND SYSTEMS FOR OPERATING A LIGHTING DEVICE

BACKGROUND AND SUMMARY

Semiconductor lighting devices, such as those for UV curing, commonly employ an array of cooling fans for dissipating heat generated from their light-emitting elements. The cooling air flow delivered by the array of cooling fans aids in mitigating elevated temperatures at the lighting device, which can otherwise increase a risk of malfunction and reduce a useful life of the light-emitting elements. Conventional methods of operating a lighting device incorporate closed loop feedback type control for operating the cooling fans to cool the lighting device while optimizing parameters such as fan noise, power consumption, and the like.

The inventors herein have recognized potential issues with the above approach. Namely, because of various industry factors such as size constraints of the UV curing environment and reductions in scale for semiconductor lighting devices, the array of cooling fans in a lighting device are typically arranged in an environment where the air flow is constrained. In particular, overall cooling capacity within the lighting device is reduced because each cooling fan is competing for this restricted air flow. Furthermore, the air flow restriction may affect each cooling fan non-uniformly, resulting in uneven discharge air flow across the array of cooling fans. Further still, other non-uniformities in heat generation and/or heat transfer characteristics across an array of light-emitting elements and/or cooling fans can also give rise to non-uniformities in cooling demand across an array of light-emitting elements in a single lighting device. Conventional lighting device control methods fail to account for this non-uniformity in cooling demand across an array of light-emitting elements, thereby increasing risks of temperature excursions and lighting device malfunction.

One approach that at least partially addresses the above issues includes a method of operating a lighting device including an array of light-emitting elements, an array of heat sinks, and an array of cooling fans, wherein each of the heat sinks corresponds to one of the light-emitting elements, and each of the cooling fans corresponds to one of the heat sinks, the method comprising, conductively coupling each of the heat sinks to the corresponding light-emitting element, directing air flow from each of the cooling fans to the corresponding heat sink, measuring heat sink temperatures corresponding to each of the heat sinks by way of a temperature sensor positioned at each of the heat sinks, adjusting a speed of each of the cooling fans to reduce a deviation of the corresponding heat sink temperature from a target temperature, and adjusting the target temperature based on an aggregate characteristic of the cooling fan speeds.

In this manner, the technical result of controlling the cooling fans in a lighting device while reducing temperature excursions and malfunction of the lighting device is provided. In particular, by adjusting the target temperature based on an aggregate characteristic of the cooling fan speeds, the control method accounts for non-uniformities in cooling demand across an array of radiation-emitting elements and cooling fans in a lighting device. Furthermore, increased cooling may be directed to regions of the lighting device with inherently higher cooling demand, while reduced cooling may be directed to regions of the lighting device with inherently lower cooling demand. In this way, overall temperatures in the lighting device may be reduced and reliability of the lighting device may be increased, as compared with conventional methods of operating lighting devices.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 7 depicts tables listing example aggregate characteristics and aggregate characteristic control conditions that may be evaluated as part of the control scheme of FIG. 3 for the methods of FIGS. 6 and 8.

DETAILED DESCRIPTION

Figure 1:
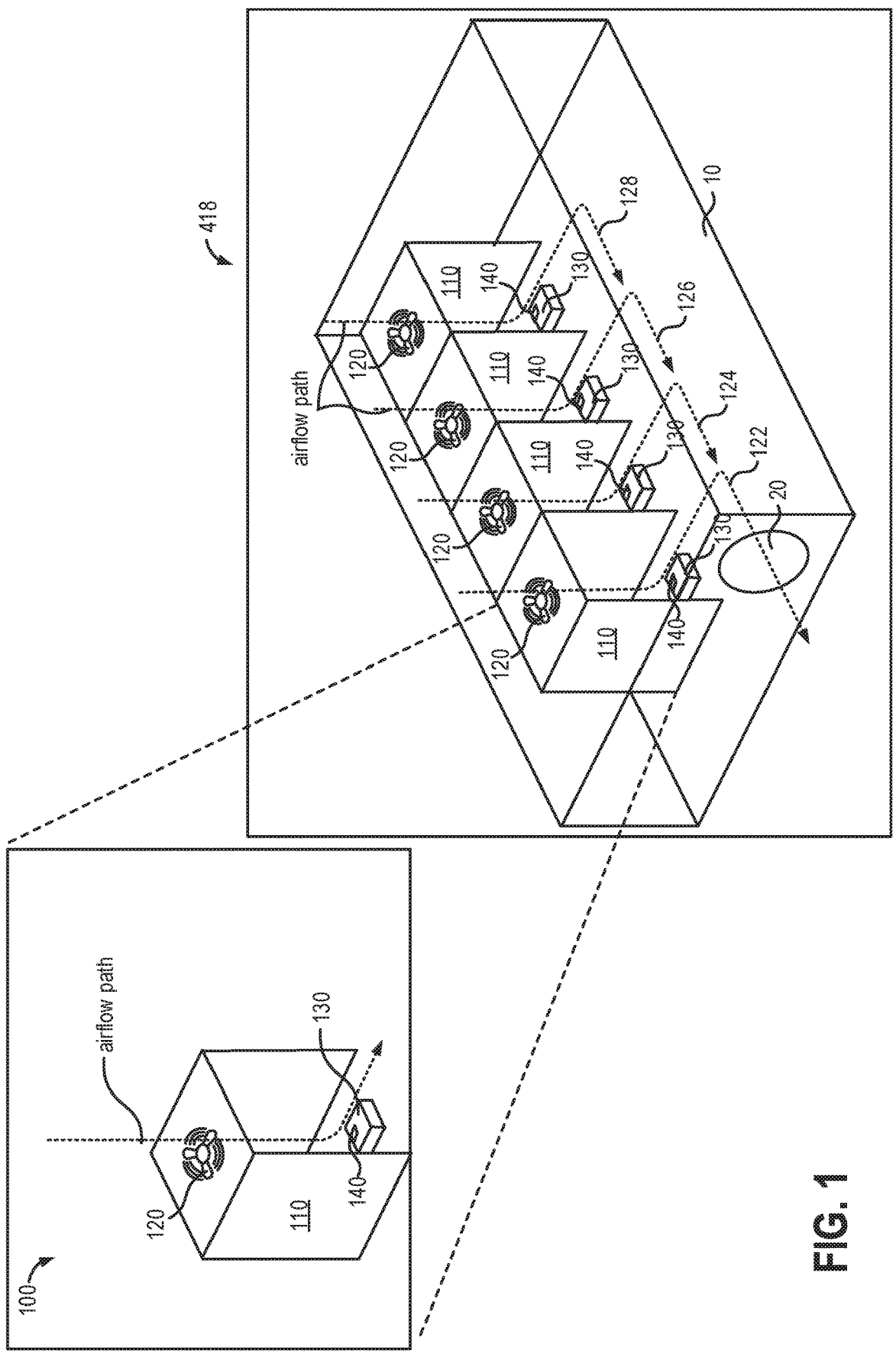
FIG. 1 is a schematic illustrating an array of cooling modules in a cooling subsystem for a lighting device, such as the lighting device of FIG. 4.
Figure 2:
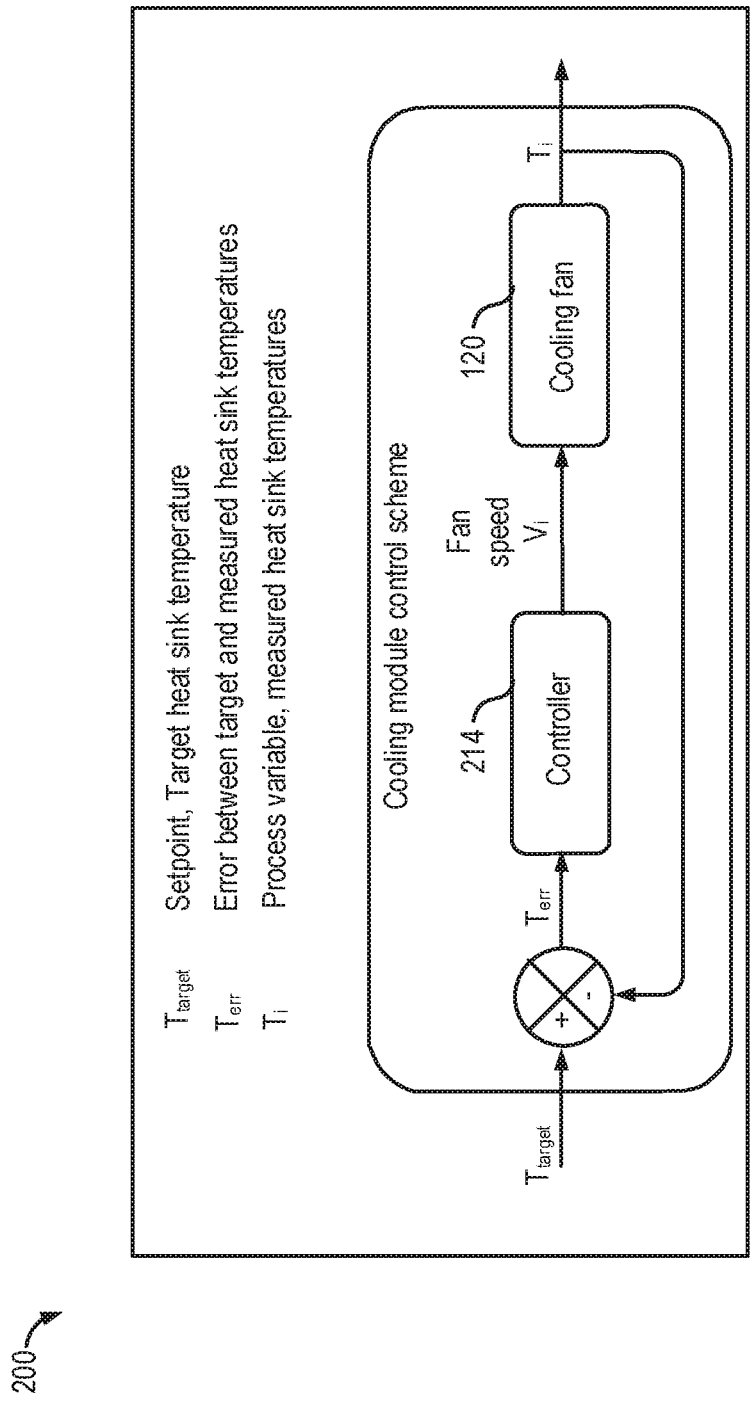
FIG. 2 is a schematic illustrating a control diagram for a lighting module, the lighting module including a cooling module, such as one of the cooling modules of FIG. 1.
Figure 3:
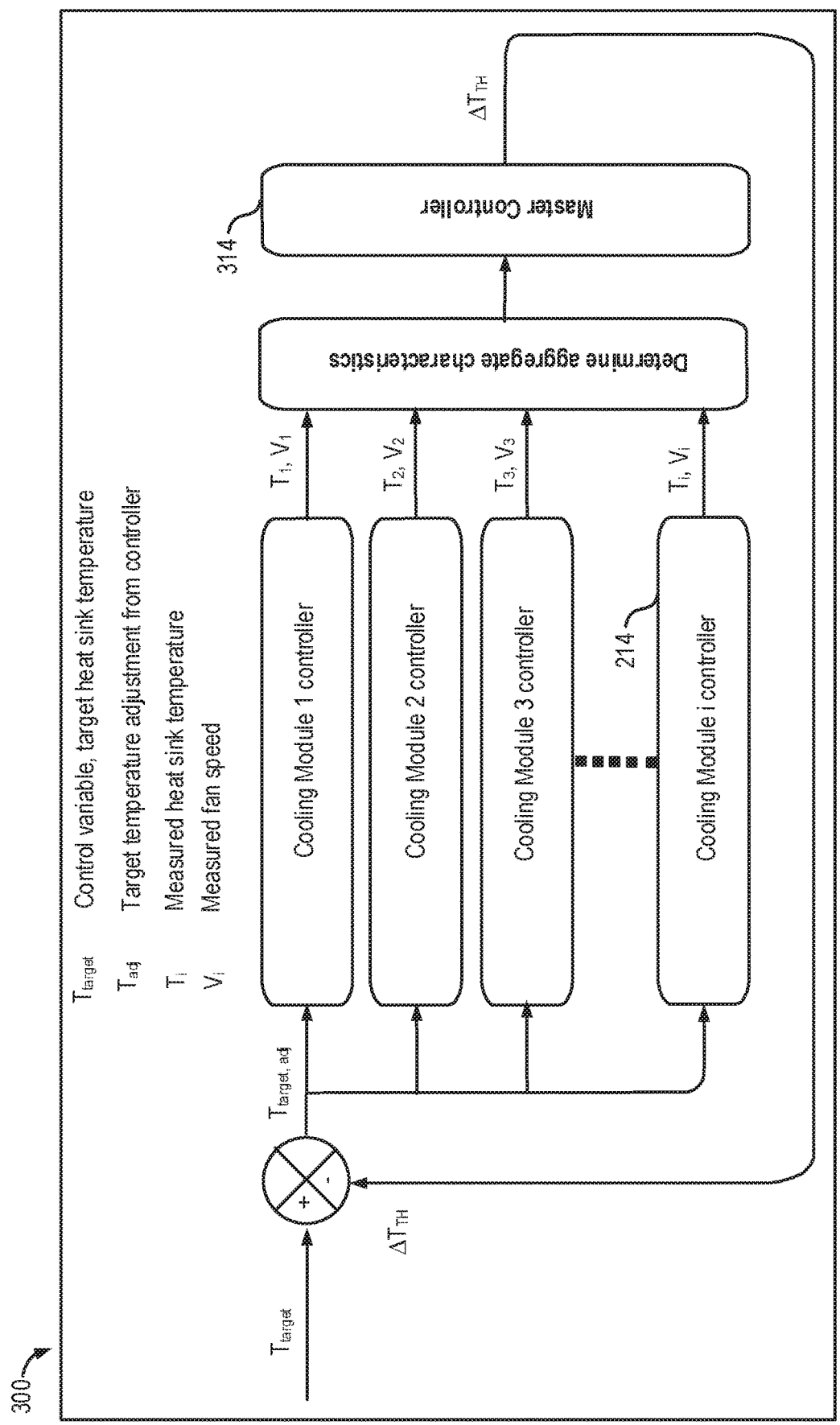
FIG. 3 is a schematic illustrating a control diagram for an array of lighting modules in a lighting device, each of the lighting modules including one of the cooling modules of FIG. 1.
Figure 4:
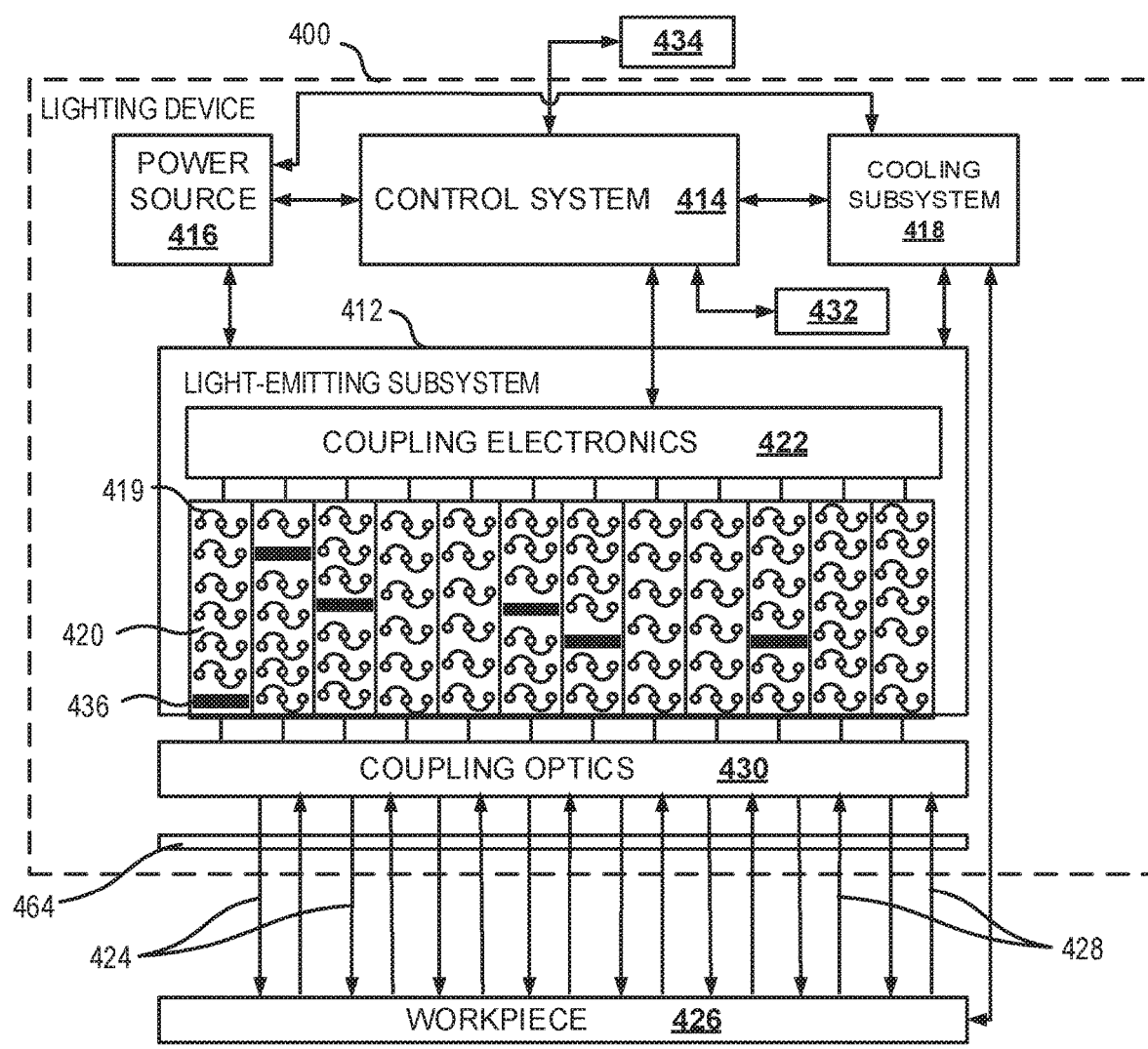
FIGS. 4 and 5 are schematics illustrating an example of a lighting system, including a lighting device with an array of lighting modules.
Figure 5:
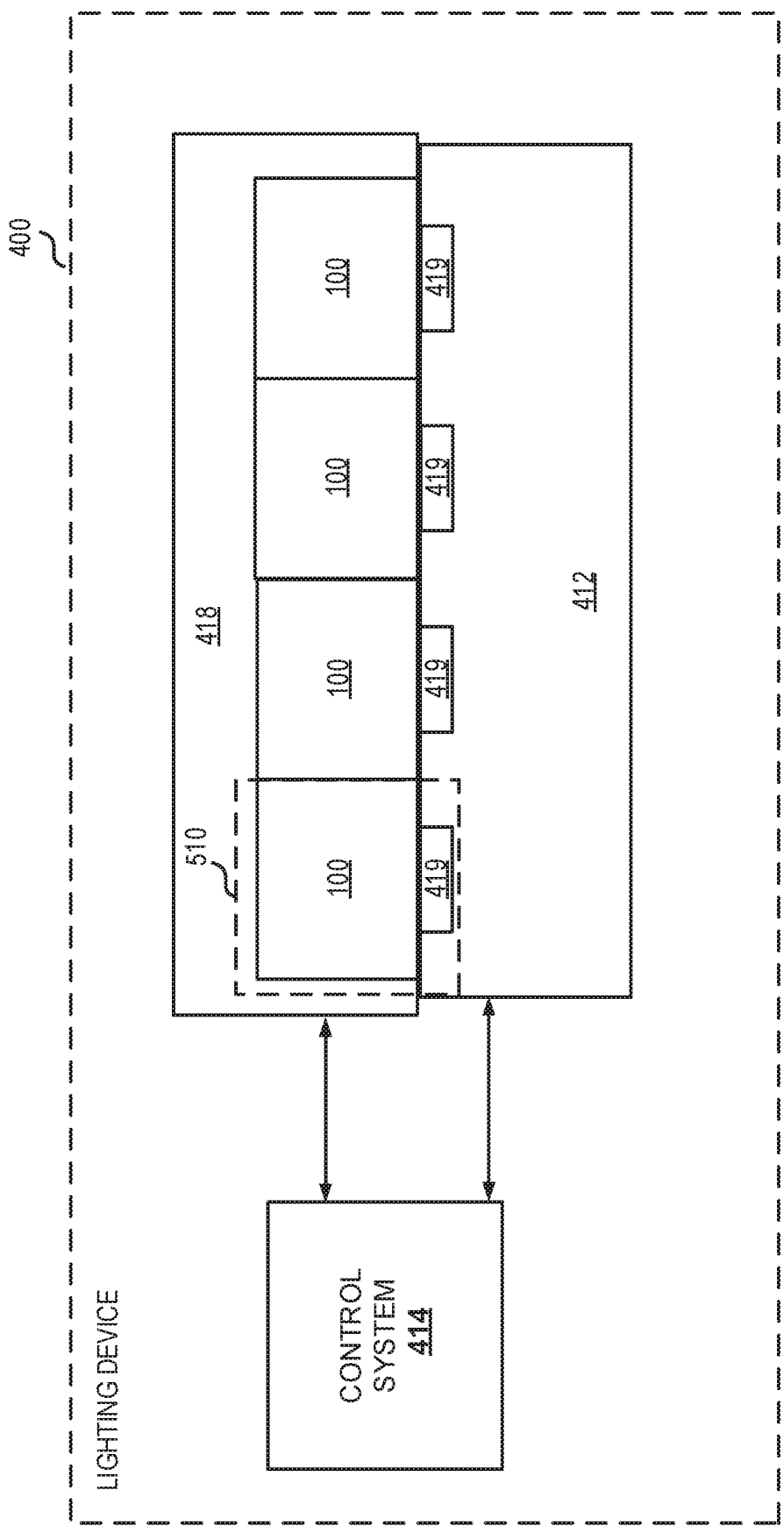

The present description relates to a lighting device, and methods and systems of operating the lighting device, which increase reliability and reduce overall operating temperatures relative to conventional systems and methods by determining a target temperature based on an aggregate characteristic of the lighting modules. FIGS. 4 and 5 illustrate schematics of a lighting device, including a cooling subsystem and a control system. Cooling subsystem of FIG. 4 may include an array of cooling modules, as depicted in FIG. 1. The lighting devices of FIGS. 4 and 5 may also include one or more lighting modules, such as the array of lighting modules depicted in FIG. 5. The control system of the lighting device in FIGS. 4 and 5 may include a plurality of controllers that work in tandem to execute one or more control schemes for operating the lighting modules, for example, according to the control diagrams illustrated in FIGS. 2-3. The control schemes of FIGS. 2-3 are further illustrated by the method flow charts of FIGS. 6 and 8.

Referring now to FIG. 4, it illustrates a block diagram for an example configuration of a lighting device 400. In one example, lighting device 400 may comprise a light-emitting subsystem 412, a control system 414, a power source 416 and a cooling subsystem 418. The light-emitting subsystem 412 may comprise a plurality of semiconductor devices 419. The plurality of semiconductor devices 419 may include a linear or two-dimensional array 420 of radiation-emitting elements such as an array of light-emitting elements such as LED devices, for example. In other examples, the radiation-emitting elements may include other radiation-emitting electronic components such as transistors (e.g., MOSFET), CPU processors, power source, and the like. Semiconductor devices 419 may provide radiant output 424, including one or more of visible light, ultra-violet (UV) light, and infrared (IR) radiation. The radiant output 424 may be directed to a workpiece 426 located at a fixed plane from lighting device 400. Returned radiation 428 may be retro-reflected back to the light-emitting subsystem 412 from the workpiece 426 (e.g., via reflection of the radiant output 424). In some examples, the workpiece 426 may include a retro-reflective surface.

The radiant output 424 may be directed to the workpiece 426 via coupling optics 430. The coupling optics 430, if used, may be variously implemented. As an example, the coupling optics may include one or more layers, materials or other structures interposed between the semiconductor devices 419 and workpiece 426, and providing radiant output 424 to surfaces of the workpiece 426. As an example, the coupling optics 430 may include a micro-lens array to enhance collection, condensing, collimation or otherwise the quality or effective quantity of the radiant output 424. As another example, the coupling optics 430 may include a micro-reflector array. In employing such a micro-reflector array, each semiconductor device providing radiant output 424 may be disposed in a respective micro-reflector, on a one-to-one basis. As another example, a linear array of semiconductor devices 420 providing radiant output 424 may be disposed in macro-reflectors, on a many-to-one basis. In this manner, coupling optics 430 may include both micro-reflector arrays, wherein each semiconductor device is disposed on a one-to-one basis in a respective micro-reflector, and macro-reflectors wherein the quantity and/or quality of the radiant output 424 from the semiconductor devices is further enhanced by macro-reflectors. Lighting device 400 may further include a transparent window 464 interposed between the coupling optics 430 and the workpiece 426.

Each of the layers, materials or other structure of coupling optics 430 may have a selected index of refraction. By properly selecting each index of refraction, reflection at interfaces between layers, materials and other structures in the path of the radiant output 424 (and/or retro-reflected radiation 428) may be selectively controlled. As an example, by controlling differences in such indexes of refraction at a selected interface, for example window 464, disposed between the semiconductor devices to the workpiece 426, reflection at that interface may be reduced or increased so as to enhance the transmission of radiant output at that interface for ultimate delivery to the workpiece 426. For example, the coupling optics may include a dichroic reflector where certain wavelengths of incident light are absorbed, while others are reflected and focused to the surface of workpiece 426.

The coupling optics 430 may be employed for various purposes. Example purposes include, among others, to protect the semiconductor devices 419, to retain cooling fluid associated with the cooling subsystem 418, to collect, condense and/or collimate the radiant output 424, to collect, direct or reject retro-reflected radiation 428, or for other purposes, alone or in combination. As a further example, the lighting device 400 may employ coupling optics 430 so as to enhance the effective quality, uniformity, or quantity of the radiant output 424, particularly as delivered to the workpiece 426.

As a further example, coupling optics 430 may comprise a cylindrical lens through which light emitted from the linear array of radiation-emitting elements is directed. As previously described, light emitted from the linear array of radiation-emitting elements may be incident at an incident face of the cylindrical lens, and may be collimated and redirected out of an emitting face of the cylindrical lens. The cylindrical lens may include one or more of a rod lens, a semi-circular lens, a plano-convex lens, a bi-convex lens, and a faceted Fresnel lens. The cylindrical lens may include a cylindrical lens having a cylindrical power axis and an orthogonal plano axis, for collimating and/or focusing the light emitted from the linear array 420 of semiconductor devices 419.

Selected of the plurality of semiconductor devices 419 may be coupled to the control system 414 via coupling electronics 422, so as to provide data to the control system 414. Control system 414 may include a plurality of controllers working in tandem to control operation of the lighting device. As further described herein, control system 414 may further include multiple controllers configured to operate in a master-slave cascading control scheme. As described further below, the control system 414 may also be implemented to control such data-providing semiconductor devices, for example, via the coupling electronics 422. The control system 414 may be electrically connected to, and may be implemented to control, the power source 416, and the cooling subsystem 418. Moreover, the control system 414 may transmit and/or receive data from power source 416 and cooling subsystem 418. In one example, the irradiance at one or more locations at the workpiece 426 surface may be detected by sensors and transmitted to control system 414 in a feedback control scheme. In a further example, control system 414 may communicate with a controller of another lighting system (not shown in FIG. 4) to coordinate control of both lighting systems. For example, control system 414 of multiple lighting systems may operate in a master-slave cascading control algorithm, where the set point of one or more of the controllers is set by the output of the other controller. Other control strategies for operation of lighting device 400 in conjunction with another lighting system may also be used. As another example, control system 414 for multiple lighting systems arranged side by side may control lighting systems in an identical manner for increasing uniformity of irradiated light across multiple lighting systems.

In addition to the power source 416, cooling subsystem 418, and light-emitting subsystem 412, the control system 414 may also be connected to, and implemented to control internal element 432, and external element 434. Element 432, as shown, may be internal to the lighting device 400, while element 434, as shown, may be external to the lighting device 400, but may be associated with the workpiece 426 (e.g., handling, cooling or other external equipment) or may be otherwise related to a photoreaction (e.g. curing) that lighting device 400 supports.

The data received by the control system 414 from one or more of the power source 416, the cooling subsystem 418, the light-emitting subsystem 412, and/or elements 432 and 434, may be of various types. As an example, the data may be representative of one or more characteristics associated with coupled semiconductor devices 419. As another example, the data may be representative of one or more characteristics associated with the respective light-emitting subsystem 412, power source 416, cooling subsystem 418, internal element 432, and external element 434 providing the data. As still another example, the data may be representative of one or more characteristics associated with the workpiece 426 (e.g., representative of the radiant output energy or spectral component(s) directed to the workpiece). Moreover, the data may be representative of some combination of these characteristics.

The control system 414, in receipt of any such data, may be implemented to respond to that data. For example, responsive to such data from any such component, the control system 414 may be implemented to control one or more of the power source 416, cooling subsystem 418, light-emitting subsystem 412 (including one or more such coupled semiconductor devices), and/or the elements 432 and 434. As an example, responsive to data from the light-emitting subsystem indicating that the light energy is insufficient at one or more points associated with the workpiece, the control system 414 may be implemented to either (a) increase the power source's supply of power to one or more of the semiconductor devices, (b) increase cooling of the light-emitting subsystem via the cooling subsystem 418 (e.g., certain light-emitting devices, if cooled, provide greater radiant output), (c) increase the time during which the power is supplied to such devices, or (d) a combination of the above.

Individual semiconductor devices 419 of the light-emitting subsystem 412 may be controlled independently by control system 414. For example, control system 414 may control a first group of one or more individual LED devices to emit light of a first intensity, wavelength, and the like, while controlling a second group of one or more individual LED devices to emit light of a different intensity, wavelength, and the like. The first group of one or more individual LED devices may be within the same linear array 420 of semiconductor devices, or may be from more than one linear array of semiconductor devices 420 from multiple lighting devices 400. Linear array 420 of semiconductor device may also be controlled independently by control system 414 from other linear arrays of semiconductor devices in other lighting systems. For example, the semiconductor devices of a first linear array may be controlled to emit light of a first intensity, wavelength, and the like, while those of a second linear array in another lighting system may be controlled to emit light of a second intensity, wavelength, and the like.

As a further example, under a first set of conditions (e.g. for a specific workpiece, photoreaction, and/or set of operating conditions) control system 414 may operate lighting device 400 to implement a first control strategy, whereas under a second set of conditions (e.g. for a specific workpiece, photoreaction, and/or set of operating conditions) control system 414 may operate lighting device 400 to implement a second control strategy. As described above, the first control strategy may include operating a first group of one or more individual semiconductor devices 419 to emit light of a first intensity, wavelength, and the like, while the second control strategy may include operating a second group of one or more individual LED devices to emit light of a second intensity, wavelength, and the like. The first group of LED devices may be the same group of LED devices as the second group, and may span one or more arrays of LED devices, or may be a different group of LED devices from the second group, but the different group of LED devices may include a subset of one or more LED devices from the second group.

The cooling subsystem 418 may be implemented to manage the thermal behavior of the lighting device 400, including managing the thermal behavior of one or more components of the power source 416, control system 414, and light-emitting subsystem 412. For example, the cooling subsystem 418 may provide for cooling of light-emitting subsystem 412, and more specifically, electronic components thereof such as the semiconductor devices 419. As other examples, the cooling subsystem 418 may provide for cooling of electronic components such as CPU processors, transistors (e.g., MOSFET), power sources, and the like, of lighting device 400. Furthermore, the cooling subsystem 418 may also be implemented to cool the workpiece 426 and/or the space between the workpiece 426 and the lighting device 400 (e.g., the light-emitting subsystem 412). For example, cooling subsystem 418 may comprise an air or other fluid (e.g., water) cooling system. Cooling subsystem 418 may also include cooling elements such as cooling fins and/or heat sinks conductively coupled and/or attached to the semiconductor devices 419, or linear array 420 thereof, or to the coupling optics 430. For example, cooling subsystem may include an array of cooling fans for blowing cooling air over the coupling optics 430, wherein the coupling optics 430 are equipped with external fins to enhance heat transfer. Additionally or alternatively, as further described herein, the cooling subsystem 418 may include an array of cooling fans for discharging air flow on to or over heat sinks conductively coupled to the radiation-emitting elements.

The lighting device 400 may be used for various applications. Examples include, without limitation, curing applications ranging from displays, photoactive adhesives, and ink printing to the fabrication of DVDs and lithography. The applications in which the lighting device 400 may be employed can have associated operating parameters. That is, an application may have associated operating parameters as follows: provision of one or more levels of radiant power, at one or more wavelengths, applied over one or more periods of time. In order to properly accomplish the photoreaction associated with the application, optical power may be delivered at or near the workpiece 426 at or above one or more predetermined levels of one or a plurality of these parameters (and/or for a certain time, times or range of times).

In order to follow an intended application's parameters, the semiconductor devices 419 providing radiant output 424 may be operated in accordance with various characteristics associated with the application's parameters, e.g., temperature, spectral distribution and radiant power. At the same time, the semiconductor devices 419 may have certain operating specifications, which may be associated with the semiconductor devices' fabrication and, among other things, may be followed in order to preclude destruction and/or forestall degradation of the devices. Other components of the lighting device 400 may also have associated operating specifications. These specifications may include ranges (e.g., maximum and minimum) for operating temperatures and applied electrical power, among other parameter specifications.

Accordingly, the lighting device 400 may support monitoring of the application's parameters. In addition, the lighting device 400 may provide for monitoring of semiconductor devices 419, including their respective characteristics and specifications. Moreover, the lighting device 400 may also provide for monitoring of selected other components of the lighting device 400, including its characteristics and specifications.

Providing such monitoring may enable verification of the system's proper operation so that operation of lighting device 400 may be reliably evaluated. For example, lighting device 400 may be operating improperly with respect to one or more of the application's parameters (e.g. temperature, spectral distribution, radiant power, and the like), any component's characteristics associated with such parameters and/or any component's respective operating specifications. The provision of monitoring may be responsive and carried out in accordance with the data received by the control system 414 from one or more of the system's components.

Monitoring may also support control of the system's operation. For example, a control strategy may be implemented via the control system 414, the control system 414 receiving and being responsive to data from one or more system components. This control strategy, as described above, may be implemented directly (e.g., by controlling a component through control signals directed to the component, based on data respecting that components operation) or indirectly (e.g., by controlling a component's operation through control signals directed to adjust operation of other components). As an example, a semiconductor device's radiant output may be adjusted indirectly through control signals directed to the power source 416 that adjust power applied to the light-emitting subsystem 412 and/or through control signals directed to the cooling subsystem 418 that adjust cooling applied to the light-emitting subsystem 412.

Control strategies may be employed to enable and/or enhance the system's proper operation and/or performance of the application. In one example, the irradiance at one or more locations at the workpiece 426 surface may be detected by sensors and transmitted to control system 414 in a feedback control scheme.

In some applications, high radiant power may be delivered to the workpiece 426. Accordingly, the light-emitting subsystem 412 may be implemented using an array of light-emitting semiconductor devices 420. For example, the light-emitting subsystem 412 may be implemented using a high-density, light-emitting diode (LED) array. Although linear array of light-emitting elements may be used and are described in detail herein, it is understood that the semiconductor devices 419, and linear arrays 420 thereof, may be implemented using other light-emitting technologies without departing from the principles of the invention; examples of other light-emitting technologies include, without limitation, organic LEDs, laser diodes, other semiconductor lasers.

Continuing with FIG. 4, the plurality of semiconductor devices 419 may be provided in the form of one or more arrays 420, or an array of arrays, as shown in FIG. 4. The arrays 420 may be implemented so that one or more, or most of the semiconductor devices 419 are configured to provide radiant output. At the same time, however, one or more of the array's semiconductor devices 419 may be implemented so as to provide for monitoring selected of the array's characteristics. One or more monitoring devices 436 may be selected from among the devices in the array and, for example, may have the same structure as the other, emitting devices. For example, the difference between emitting and monitoring may be determined by the coupling electronics 422 associated with the particular semiconductor device (e.g., in a basic form, an LED array may have monitoring LED devices where the coupling electronics provides a reverse current, and emitting LED devices where the coupling electronics provides a forward current).

Furthermore, based on coupling electronics, selected of the semiconductor devices in the array may be either/both multifunction devices and/or multimode devices, where (a) multifunction devices may be capable of detecting more than one characteristic (e.g., either radiant output, temperature, magnetic fields, vibration, pressure, acceleration, and other mechanical forces or deformations) and may be switched among these detection functions in accordance with the application parameters or other determinative factors and (b) multimode devices may be capable of emission, detection and some other mode (e.g., off) and may be switched among modes in accordance with the application parameters or other determinative factors.

Turning now to FIG. 1, it illustrates a detailed schematic of an example cooling subsystem 418 for a lighting device 400. Cooling subsystem 418 includes a plurality of cooling modules 100 positioned within a cooling subsystem housing 10. Each of the cooling modules 100 includes a cooling fan 120 mounted at a cooling module housing 110, a heat sink 130 positioned within the cooling module housing 110, and a temperature sensor 140 positioned at and conductively coupled to the heat sink 130. Each of the heat sinks 130 may be conductively coupled to a separate semiconductor device 419 (as shown in FIG. 5) such as a light-emitting element, whereby each heat sink 130 may conduct heat away from the corresponding light-emitting element. As illustrated in the schematic in FIG. 5, lighting device 400 includes an array of lighting modules 510, each of the lighting modules including a cooling module 100 conductively coupled to one or more semiconductor devices 419 of the light-emitting subsystem 412. In one example, each of the cooling modules 100 may be conductively coupled to an array of radiation-emitting elements. Furthermore, each cooling fan 120 may cool the corresponding heat sink 130 in a cooling module 100 by discharging outlet air flow from the cooling fan 120 on to and over the surface of the heat sink 130, thereby dissipating heat from the one or more semiconductor devices 419 conductively coupled thereto. Although not shown in FIG. 1, cooling modules may include other cooling elements such as baffles, fins, additional fans and/or heat sinks, and the like.

Housing 10 may include an exhaust port 20 through which outflow air from the cooling fans 120 may exit the housing after being directed on to and over the surface of heat sinks 130. The plurality of cooling modules 100 may be positioned asymmetrically relative to the exhaust port 20 such that the discharge outlet air flow path lengths (e.g., 122, 124, 126, 128) from each of the cooling modules 100 to the exhaust port 20 may each be different. As shown in the example of FIG. 1, the array of cooling modules 100 are positioned in a linear array whereby the discharge outlet air flow path lengths 122, 124, 126, and 128 differ in the air flow path lengths between each corresponding heat sink 130 and the exhaust port 20; however, in other examples, the discharge outlet air flow path lengths may additionally or alternatively differ in the air flow path lengths between each cooling fan 120 and its corresponding heat sink 130. In other examples, the cooling modules may be arranged in a non-linear array or in a non-regular or random arrangement.

Further still, as shown in FIG. 1, the exhaust port 20 may be the only exhaust port 20 through which outlet air flow may exit housing 10. In other words, housing 10 may have only a single exhaust port 20. In this way, exhaust port 20 may restrict the air flow out of the housing 10. Furthermore, the restriction of the air flow may be more pronounced when the outlet air flow path length corresponding to an individual cooling module is larger. For example, discharge air following outlet air flow path length 128 may be more restricted from flowing out of exhaust port 20 as compared with discharge air following outlet air flow path length 124. In other example lighting devices, housing 10 may include a plurality of exhaust ports 20, positioned asymmetrically relative to the cooling modules 100. As such, the discharge air flow may still be restricted relative to one or more cooling modules even in the presence of more than one exhaust port 20. In other words, cooling demand and heat dissipation resulting from cooling air discharged from cooling module cooling fans may be non-uniform across each of the cooling modules.

TABLE 1

Cooling module heat transfer characteristics

| Heat Transfer characteristic | Influencing factors |
| --- | --- |
| Heat sink heat capacity | Mass, dimensions, material of construction (thermal conductivity, specific heat capacity), size/shape/design (fins, hollow/solid, geometry) |
| Cooling fan cooling capacity | Air flow vs. fan speed efficiency curve |
| Discharge air flow path length | Relative positions of fan and heat sink, exhaust port size/number/position, baffles/obstructions |
| Cooling fan inlet air temperature | Relative fan position, inlet air environment |
| Heat generation characteristic | |
| Light-emitting element power | On-time usage/power, degradation over useful life |
| Lighting module environment | Proximity to heat sources, local ambient temperature |

In the example of FIG. 1, each of the cooling modules are depicted similarly; however, in some examples, each of the cooling modules 100 may differ in one or more heat transfer characteristics that influence the cooling capacity of a particular cooling module, including the discharge outlet air flow path length and/or discharge outlet air flow, as described above. As shown in Table 1, other example heat transfer characteristics that may differ for one or more cooling modules include a heat sink cooling capacity, cooling fan cooling capacity, and a cooling fan inlet air temperature. The heat sink cooling capacity refers to the ability of a heat sink to dissipate heat (e.g., the amount and rate of heat dissipated) away from the corresponding light-emitting element. As such, the heat sink heat capacity may depend on individual heat sink properties such as thermal conductivity and specific heat capacity, the size/shape/dimensions of the heat sink as well as other design considerations (fins, hollow vs. solid), the material of construction, and the mass of the heat sink. In this way, the heat sink heat cooling capacity can influence the rate of increase in a heat sink temperature due to absorption of heat dissipated from a light-emitting element conductively coupled thereto, and the rate of decrease in the heat sink temperature due to heat dissipation from the corresponding cooling fan.

The cooling fan cooling capacity may refer to a rate of air intake and/or discharge achievable by the cooling fan, an efficiency of the cooling fan, and an achievable speed of the cooling fan. Cooling fans achieving higher fan rotational speeds may achieve higher rates of intake and/or discharge of air, and thereby exhibit higher cooling capacities. Cooling fans having higher efficiency may exhibit higher intake and/or discharge air flow rates at an equivalent fan speed, thereby exhibiting higher cooling capacities.

The cooling fan air inlet temperature may be influenced by the local environment adjacent to an individual cooling fan. When a cooling fan air inlet temperature is lower, a cooling fan cooling capacity may be increased since a difference in the temperatures between the cooling air discharged by the cooling fan and its corresponding heat sink in a cooling module may be higher. Conversely, the cooling fan cooling capacity may be decreased when a cooling fan air inlet temperature is higher because a difference in the temperatures between the cooling air discharged by the cooling fan and its corresponding heat sink in a cooling module may be higher.

As indicated in Table 1, the discharge air flow path length may be affected by several factors including the relative positions of fan and heat sink, exhaust port size/number/position, and the presence of baffles or other obstructions along the air flow path. When the path of the discharge air flow from a cooling fan to the corresponding heat sink in a cooling module is longer, more tortuous, and/or more interrupted (by baffles, obstructions, and the like), cooling of the heat sink may be reduced. Conversely, when the path of the discharge air flow from a cooling fan to the corresponding heat sink in a cooling module is shorter, less tortuous, and/or less interrupted (by baffles, obstructions, and the like), cooling of the heat sink may be increased.

In addition to heat transfer characteristics, each of the lighting modules 510 may differ in one or more heat generation characteristics, also shown in Table 1, such as light-emitting element power and lighting module environment. Light-emitting element power may refer to the power supplied to one or more light-emitting elements of a lighting module, and may be determined by the power-on time and the usage of the light-emitting element. For example, light-emitting elements powered 100% for longer durations may generate more heat than light-emitting elements powered for shorter durations and/or at less than 100% power. Furthermore, the inherent power of each light-emitting element across lighting modules may be non-uniform. Further still, non-uniform light-emitting element power across lighting modules may arise due to non-uniform degradation of light-emitting elements in a lighting device.

Lighting module environment may refer to a lighting module's proximity to external heat sources. In one example, lighting modules positioned more towards the center of a lighting module array may be subject to higher rates of heat generation from surrounding lighting modules as compared to lighting modules positioned more towards the edges of a lighting module array. Similarly, lighting modules positioned with increased proximity relative to other heat-generating devices (e.g., power modules) maybe subject to higher rates of heat generation, thereby exhibiting higher temperatures than other lighting modules positioned with reduced proximity relative to other heat-generating devices.

Because one or more heat transfer characteristics differ for one or more cooling modules and/or because one or more heat generation characteristics differ for one or more lighting modules, the cooling demand for each lighting module may be different. As such, a control scheme that accounts for the non-uniformities in cooling demand across an array of lighting modules is advantageous for reducing temperatures and increasing useful life during operation of a lighting device. In this way, it is advantageous for a control system to account for non-uniformities in heat sink cooling capacities, cooling fan cooling capacities, discharge air flow path lengths, and cooling fan inlet air temperatures across an array of cooling modules so that higher temperatures excursions in individual cooling modules with lower heat sink cooling capacities can be reduced.

Each of the cooling modules 100 may be conductively coupled to a controller such as a PID controller, of control system 414, for controlling a speed of the cooling fan 120 based on a temperature of the corresponding heat sink 130 in the cooling module 100. The temperature of each heat sink 130 may be transmitted to the control system 414 by the corresponding temperature sensor 140 in the cooling module 100. As described in further detail herein, the control system 414 may include a plurality of slave controllers, each slave controller controlling an individual cooling module cooling fan based on the cooling module heat sink temperature, and one or more master controllers in a cascade arrangement with the plurality of cooling module controllers.

Turning now to FIG. 2, it illustrates an example control diagram 200 for a control scheme for each of the individual cooling modules 100. As shown in FIG. 2, the cooling module controller 214 controls a speed, $V_i$, of the cooling fan 120 to achieve a target heat sink temperature, $T_{target}$. The target heat sink temperature and the measured heat sink temperature for the $i^{th}$ cooling module, $T_i$, are input to the controller 214. As described previously, each controller 214 may include a PID (proportional, integral, derivative) controller and may be part of the control system 414 of the lighting device 400. Controller 214 calculates an error signal, $T_{err}$, based on the deviation of the measured heat sink temperature $T_i$ from $T_{target}$, and adjusts the cooling fan speed, $V_i$, to reduce the error signal $T_{err}$ and to achieve a heat sink temperature equivalent to $T_{target}$.

Turning now to FIG. 3, it illustrates an example control diagram 300 for a control scheme for a lighting device 400, including an array of cooling modules 100, each controlled by a controller 214 according to the control scheme of control diagram 200. Control diagram 300 illustrates a cascade control strategy with a master controller 314 arranged in cascade with the slave cooling module controllers 214. Master controller 314 is included within control system 414 and may receive signals from the lighting modules such as heat sink temperature, $T_i$, and cooling fan speeds, $V_i$. As such, with each control loop iteration, the master controller calculates and outputs a threshold temperature difference, $\Delta T_{TH}$, and an adjusted set point target temperature, $T_{target,adj}$, based on the threshold temperature difference and the previous target temperature, $T_{target}$, to each of the cooling module controllers 214. In one example $\Delta T_{TH}$ includes 1 degree Celsius; however, the master controller 314 may adjust $\Delta T_{TH}$ depending on one or more aggregate characteristics, as further described herein. The master controller 314 determines the adjusted set point target temperature based on one or more aggregate characteristics of the cooling modules. In particular, the master controller 314 determines the adjusted set point target temperature based on one or more aggregate characteristics of the cooling module heat sink temperatures, $T_i$, and/or cooling module cooling fan speeds, $V_i$. Decreasing $T_{target}$ corresponds to an overall increase in cooling air flow output by the cooling modules, whereas increasing $T_{target}$ corresponds to an overall decrease in cooling air flow output by the cooling modules.

An aggregate characteristic may refer to a quantity calculated from a combination of data (e.g., aggregate data) from a plurality of cooling modules. The aggregate characteristics may be determined on board the control system 414 of the lighting device 400 from a combination of data received from a plurality of cooling modules 100. In some examples, the master controller 314 may calculate one or more aggregate characteristics. In some examples, the aggregate characteristics may be calculated from a combination of data from each cooling module 100 in the array of cooling modules of the lighting device 400. As one example, an aggregate characteristic may include a mean or average heat sink temperature, $\mu(T_i)$, or mean cooling fan speed, $\mu(V_i)$. In another example, an aggregate characteristic may include a standard deviation of the cooling module heat sink temperatures, $\sigma(T_i)$, or standard deviation of cooling module cooling fan speeds, $\sigma(V_i)$.

FIG. 7 shows a table of aggregate characteristics 710, and a table 720 of control actions taken by master controller 314 corresponding to aggregate characteristic control conditions being met, and is described in further detail herein. Thus, during each control loop iteration, the master controller may evaluate one or more aggregate characteristic controller conditions; if an aggregate characteristic controller condition is met, the master controller 314 may execute the corresponding control action in determining how to adjust (or maintain) the target temperature set point output to the cooling module controllers 214. In other words, the one or more aggregate characteristics are utilized by the master controller to form metrics to evaluate if the target temperature for the lighting device cooling modules is to be adjusted. By forming metrics based on one or more of the aggregate characteristics, the master controller can account for non-uniformities in cooling demand caused by discrepancies in heat transfer characteristics and/or heat generation characteristics across an array of lighting modules when determining controller actions. As such, overall lighting module temperatures may be reduced while reducing a risk of higher temperature excursions and lighting device malfunctions, thereby increasing a useful life of the lighting device, especially for arrays of lighting modules with widely varying heat transfer and/or heat generation characteristics. Although tables 710 and 720 refer to aggregate characteristics of cooling module components such as the heat sink temperatures and cooling fan speeds, the methods and systems described herein may also be applied to analogous aggregate group characteristics of one or more other lighting device electronic components such as power sources, transistors, CPU processors and the like.

Turning now to FIG. 7, Table 710 lists several example aggregate characteristics of cooling module data, including aggregate statistical characteristics of cooling module data. Max ($V_i$) and min ($V_i$) refer to the maximum (fastest) and minimum (slowest) cooling fan speeds (rpm) in an array of cooling modules. Similarly, max ($T_i$) and min ($T_i$) refer to the maximum (highest) and minimum (lowest) heat sink temperatures (degrees) in an array of cooling modules. $\sigma(T_i)$ and $\sigma(V_i)$ refer to the standard deviation of the heat sink temperatures and standard deviation of the cooling fan speeds, respectively, and $\mu(T_i)$ and $\mu(V_i)$ refer to the mean heat sink temperatures and mean cooling fan speeds, respectively. ($T_i - T_{target}$) refers to the deviation of the $i^{th}$ heat sink temperature from the target temperature; thus, $\mu(T_i - T_{target})$ refers to the mean deviation heat sink temperature deviation from the target temperature, while max($T_i-T_{target}$) and min ($T_i-T_{target}$) refer to the maximum and minimum heat sink temperature deviation from the target temperature in the cooling module array. Count ($T_i>T_{TH}$) refers to a number of heat sinks with temperatures greater than a threshold temperature, $T_{TH}$. Additional aggregate statistical measures of the cooling module data such as variance, median, mode, range, and the like may also be utilized.

Table 720 lists several example aggregate characteristic control conditions and one or more control actions corresponding to each aggregate characteristic or metric. During operation of a lighting device 400, the control system 414 may receive aggregate data from the cooling module array, determine one or more aggregate characteristics, and evaluate one or more aggregate characteristic control conditions based on the determined aggregate characteristics. Subsequently, based on the one or more characteristic control conditions being met (or not met), the control system 414 may execute one or more corresponding control actions to aid in reducing overall cooling module temperatures in the lighting device 400. Indices are provided in the first column of table 720 to aid in their description herein. The second column, $t_{elapsed}$, refers to an elapsed time since the last control action executed by master controller 314 to adjust or maintain the target temperature, $T_{target}$. The responsiveness of the heat sink temperatures to adjustments of the target temperature by the master controller 314 may depend on the heat transfer and heat generation dynamics of the cooling modules. The threshold duration, $t_{TH}$, may represent a duration over which the cooling modules can respond to control actions taken by the master controller. As such, the master controller 314 may wait until when $t_{elapsed}$ is greater than a threshold duration, $t_{TH}$, before taking a subsequent control action. Similarly, master controller 314 may refrain from taking a subsequent control action when $t_{elapsed}$ is less than $t_{TH}$, in order to allow the lighting device cooling modules to approach closer to thermal steady-state and also to allow increased settling of the cooling module controllers 214.

In one example, as illustrated in the first row of Table 720, the master controller 314 may execute a subsequent control action despite $t_{elapsed}$ being less than $t_{TH}$. In this case, master controller 314 evaluates if one or more of the heat sink temperatures, $T_i$, is greater than an upper threshold heat sink temperature, $T_{TH,upper}$ (e.g., Count ($T_i>T_{TH,upper}$)>0). The upper threshold heat sink temperature may refer to a temperature above which a risk of burning out and/or degrading a light-emitting element may be increased. Thus, despite $t_{elapsed}<t_{TH}$, master controller 314 executes the control action to increase $T_{target}$ by $\Delta T_{TH}$, to reduce a risk of burning out and/or degrading one or more lighting module light-emitting elements. In the other rows of Table 720, master controller 314 executes a control action only when $t_{elapsed}>t_{TH}$.

As shown in the second row of Table 720, the master controller 314 may evaluate the aggregate characteristic control condition while $t_{elapsed}>t_{TH}$ to determine if the maximum cooling module fan speed, max($V_i$), is greater than an upper threshold fan speed, $V_{TH,upper}$. $V_{TH,upper}$ may represent a cooling fan speed above which substantial additional cooling air flow may not be supplied. For the case where max($V_i$)>$V_{TH,upper}$, the cooling capacity of one or more cooling modules may not be increased; as such, the master controller maintains $T_{target}$ at the current value.

As shown in the third row of Table 720, the master controller 314 may evaluate the aggregate characteristic control condition while $t_{elapsed}>t_{TH}$ to determine if a standard deviation of the heat sink temperatures, $\sigma(T_i)$ is greater than an upper threshold standard deviation, $\sigma(T_i)_{TH}$. $\sigma(T_i)$ being greater than $\sigma(T_i)_{TH}$ indicates that the extent of deviation in heat sink temperatures over the array of cooling modules is higher. Owing at least partly due to the non-uniformities in heat transfer and/or heat generation characteristics across the array of lighting modules, one or more heat sink temperatures may be higher than and farther from $T_{target}$ while other heat sink temperatures may be at or nearer to $T_{target}$. Heat sink temperatures being higher and farther from $T_{target}$ may be indicative that the corresponding cooling modules are struggling to achieve $T_{target}$. As such, in response to $\sigma(T_i)>\sigma(T_i)_{TH}$, the master controller 314 increases $T_{target}$ by $\Delta T_{TH}$, to aid in reducing $\sigma(T_i)$ below $\sigma(T_i)_{TH}$.

As shown in the fourth row of Table 720, the master controller 314 may evaluate the aggregate characteristic control condition while $t_{elapsed}>t_{TH}$ to determine if $\sigma(T_i)<\sigma(T_i)_{TH}$. $\sigma(T_i)$ being less than $\sigma(T_i)_{TH}$ indicates that the extent of deviation in heat sink temperatures over the array of cooling modules is lower, and that the cooling modules are able to achieve heat sink temperatures closer to $T_{target}$. As such, in response to $\sigma(T_i)<\sigma(T_i)_{TH}$, the master controller 314 decreases $T_{target}$ by $\Delta T_{TH}$, to aid in reducing overall heat sink temperatures in the lighting device.

As shown in the fifth row of Table 720, the master controller 314 may evaluate the aggregate characteristic control condition while $t_{elapsed}>t_{TH}$ to determine if min($V_i$) is less than a lower threshold cooling fan speed, $V_{TH,lower}$. Min($V_i$) being lower than $V_{TH,lower}$ may indicate that one or more cooling modules have excess cooling capacity. As such in response to min($V_i$)<$V_{TH,lower}$, master controller 314 decreases $T_{target}$ by $\Delta T_{TH}$, to aid in reducing overall heat sink temperatures in the lighting device.

As shown in the sixth row of Table 720, the master controller 314 may evaluate the aggregate characteristic control condition while $t_{elapsed}>t_{TH}$ to determine if max($T_i$)> $T_{TH,upper}$. Similar to the aggregate characteristic control condition in row 1 of Table 720, max($T_i$)>$T_{TH,upper}$ indicates that one or more heat sink temperatures, $T_i$, is greater than $T_{TH,upper}$, increasing a risk of burnout or malfunctioning of one or more light-emitting elements. As such, in response to max($T_i$)>$T_{TH,upper}$, master controller 314 increases $T_{target}$ by $\Delta T_{TH}$, to reduce a risk of burning out and/or degrading one or more lighting module light-emitting elements.

As shown in the seventh row of Table 720, the master controller 314 may evaluate the aggregate characteristic control condition while $t_{elapsed}>t_{TH}$ to determine if the maximum heat sink temperature is greater than a lower threshold heat sink temperature, $T_{TH,lower}$, and less than $T_{TH,upper}$. $T_{TH,lower}$ may correspond to a heat sink temperature above which further decreasing $T_{target}$ may lead to a heat sink temperature increasing above $T_{TH,upper}$, leading to burnout and/or degradation of a light-emitting element. As such, in response to $T_{TH,upper}>$max($T_i$)>$T_{TH,lower}$, master controller 314 may maintain $T_{target}$ at its current value.

As shown in the eighth row of Table 720, the master controller 314 may evaluate the aggregate characteristic control condition while $t_{elapsed}>t_{TH}$ to determine if a mean deviation of the heat sink temperature from $T_{target}$, $\mu(T_i-T_{target})$, is greater than an upper threshold mean deviation in $T_i$ from $T_{target}$, $\mu(T_i-T_{target})_{TH,upper}$. $\mu(T_i-T_{target})>\mu(T_i-T_{target})_{TH,upper}$ may indicate that one or more of the cooling modules may exhibit increased difficulty in achieving a heat sink temperature of $T_{target}$. As such, in response to $\mu(T_i-T_{target})>\mu(T_i-T_{target})_{TH,upper}$, master controller 314 may increase $T_{target}$ by $\Delta T_{TH}$.

As shown in the ninth row of Table 720, the master controller 314 may evaluate the aggregate characteristic control condition while $t_{elapsed} > t_{TH}$ to determine if a mean cooling fan speed, $\mu(V_i)$, is greater than an upper threshold cooling fan speed, $\mu(V_i)_{TH,upper}$. $\mu(V_i)_{TH,upper}$ may correspond to a mean cooling fan speed above which one or more of the cooling modules are nearer to their maximum fan speeds such that the ability to provide additional cooling capacity beyond the current cooling capacity is reduced. In other words, when $\mu(V_i) > \mu(V_i)_{TH,upper}$, the cooling modules may exhibit increased difficulty in achieving a heat sink temperature of $T_{target}$. As such, in response to $\mu(V_i) > \mu(V_i)_{TH,upper}$, the master controller 314 may increase $T_{target}$ by $\Delta T_{TH}$.

As shown in the tenth row of Table 720, the master controller 314 may evaluate the aggregate characteristic control condition while $t_{elapsed} > t_{TH}$ to determine if $\mu(T_i - T_{target})$, is less than a lower threshold mean deviation in $T_i$ from $T_{target}$, $(T_i - T_{target})_{TH,lower}$. $\mu(T_i - T_{target}) < \mu(T_i - T_{target})_{TH,lower}$ may indicate that the cooling modules are more easily able to achieve a heat sink temperature of $T_{target}$. As such, in response to $\mu(T_i - T_{target}) < \mu(T_i - T_{target})_{TH,lower}$, master controller 314 may decrease $T_{target}$ by $\Delta T_{TH}$.

In addition to adjusting $T_{target}$, the master controller 314 may execute one or more control actions to adjust $t_{TH}$ and/or $\Delta T_{TH}$ responsive to one or more conditions. For example, responsive to the cooling module heat sink temperatures being closer to $T_{target}$, the master controller 314 may adjust $\Delta T_{TH}$ to be smaller since smaller control actions may reduce cycling of the cooling fan speeds while maintaining an ability to achieve heat sink temperatures of $T_{target}$. As such, row 10 of table 720 shows the control action of decreasing $\Delta T_{TH}$ responsive to $\mu(T_i - T_{target}) < \mu(T_i - T_{target})_{TH,lower}$. Conversely, responsive to the cooling module heat sink temperatures being farther from $T_{target}$, the master controller 314 may adjust $\Delta T_{TH}$ to e larger since larger control actions may increase a rate at which the heat sink temperatures are able to achieve $T_{target}$. As such, row 8 of table 720 shows the control action of increasing $\Delta T_{TH}$ responsive to $\mu(T_i - T_{target}) > \mu(T_i - T_{target})_{TH,upper}$.

Master controller 314 may also adjust $t_{TH}$, decreasing $t_{TH}$ in order to speed up responsiveness of the control system 414, for example, when heat sink temperatures tend to be closer to or above to $T_{TH,upper}$, or when process conditions are changing at a faster rate. As such, row 8 of Table 720 shows the master controller 314 decreasing $t_{TH}$ responsive to $(T_i - T_{target}) > \mu(T_i - T_{target})_{TH,upper}$. Conversely, master controller 314 may increase $t_{TH}$ responsive to slower changing process conditions, or when slower responsiveness of the control system may be tolerated, such as when the heat sink temperatures tend to be farther (lower) from $T_{TH,upper}$. As such, row 10 of Table 720 shows the master controller 314 increasing $t_{TH}$ responsive to $\mu(T_i - T_{target}) < \mu(T_i - T_{target})_{TH,lower}$.

Additionally and or alternatively, master controller 314 may adjust $t_{TH}$ responsive to the value of $\Delta T_{TH}$, decreasing $t_{TH}$ when $\Delta T_{TH}$ is larger to increase responsiveness of the control system when making larger adjustments to $T_{target}$, while increasing $t_{TH}$ when $\Delta T_{TH}$ is smaller to reduce responsiveness of the control system when making smaller adjustments to $T_{target}$. Furthermore, master controller may also adjust $t_{TH}$ responsive to the cooling module cooling fan speeds. For example, as shown in row 2 of Table 720, $t_{TH}$ may be reduced responsive to $\max(V_i)$ being greater than $V_{TH,upper}$. In this way, the control system may be more responsive to monitoring the heat sink temperatures when one or more cooling fans greater than $V_{TH,upper}$, since the ability to provide additional cooling capacity is reduced, and a risk of a heat sink temperature increasing above $T_{TH,upper}$ is increased.

Figure 6:
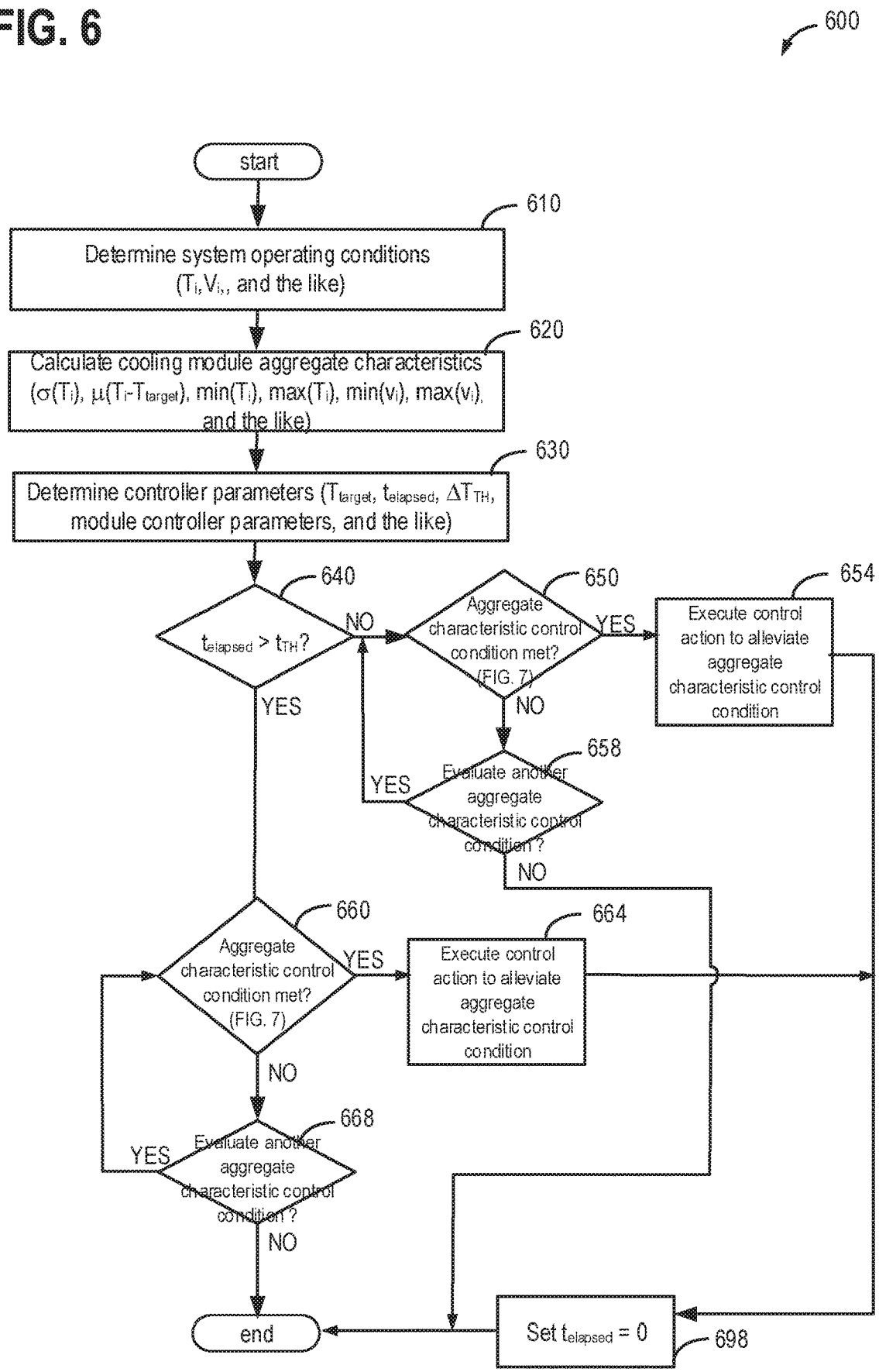
FIGS. 6 and 8 are example flow charts for a method for operating the lighting device of FIGS. 4 and 5.

Turning now to FIG. 6, it illustrates a flow chart for a generalized method 600 of operating a lighting device 400. Method 600 may include executable instructions residing on board non-transitory memory of control system 414, including master controller 314. Method 600 begins at 610 where control system 414 determines various system operating conditions such as each of the cooling module heat sink temperatures, $T_i$, cooling fan speeds, $V_i$, and the like. Next, at 620, the control system 414 calculates one or more of the cooling module aggregate characteristics, such as the aggregate characteristics listed in Tables 710 and 720 of FIG. 7. Next, at 630, control system 414 determines controller parameters including a current target temperature, $T_{target}$, an elapsed time since the last control action, $t_{elapsed}$, and a current threshold temperature difference, $\Delta T_{TH}$. At 630, determining $t_{elapsed}$ may include incrementing $t_{elapsed}$ to account for the elapsed time since the last control iteration when method 600 was executed.

Next, at 640, the control system 414 determines if $t_{elapsed}$ is greater than the threshold duration, $t_{TH}$. For the case when $t_{elapsed}$ is not greater than $t_{TH}$, method 600 continues at 650 where the control system 414 evaluates if an aggregate characteristic control condition is met. If the aggregate control condition is met, method 600 proceeds to 654 where a corresponding control action is executed to aid in alleviating the aggregate characteristic control condition. After 654, method 600 proceeds to 698 where $t_{elapsed}$ is set to 0 before method 600 ends. For the case where the aggregate characteristic control condition is not met, method 600 proceeds to 658 where the control system 414 determines if additional aggregate characteristic control conditions are to be evaluated. For the case where additional aggregate characteristic control conditions are to be evaluated, method 600 returns to 650; for the case where additional characteristic control conditions are not to be evaluated, method 600 ends. In the example of Table 720 of FIG. 7, during the condition when $t_{elapsed} < t_{TH}$, the control system 414 only evaluates one aggregate characteristic control condition, as shown in row 1 of Table 720. In this way, the control system 414 only adjusts $T_{target}$ prior to $t_{TH}$ elapsing (e.g., $t_{elapsed} < t_{TH}$) when one or more of the heat sink temperatures is greater than $T_{TH,upper}$. However, in the generalized case of FIG. 6, additional aggregate characteristic control conditions may be evaluated by the control system 414 during the condition when $t_{elapsed} < t_{TH}$.

Returning to 640 for the case where $t_{elapsed} > t_{TH}$, method 600 continues to 660 where the control system 414 evaluates if an aggregate characteristic control condition is met. If the aggregate control condition is met, method 600 proceeds to 664 where a corresponding control action is executed to aid in alleviating the aggregate characteristic control condition. After 664, method 600 proceeds to 698 where $t_{elapsed}$ is set to 0 before method 600 ends. For the case where the aggregate characteristic control condition is not met, method 600 proceeds to 668 where the control system 414 determines if additional aggregate characteristic control conditions are to be evaluated. For the case where the aggregate characteristic control condition is not met, method 600 proceeds to 658 where the control system 414 determines if additional aggregate characteristic control conditions are to be evaluated. For the case where additional aggregate characteristic control conditions are to be evaluated, method 600 returns to 660; for the case where additional characteristic control conditions are not to be evaluated, method 600 ends.

As shown in the example of Table 720 of FIG. 7, during the condition when $t_{elapsed} > t_{TH}$, the control system 414 can evaluate ten different aggregate characteristic control conditions, and subsequently execute one or more control actions when one of those conditions is met. Thus, in the generalized case of FIG. 6, one or multiple aggregate characteristic control conditions may be evaluated by the control system 414 during the condition when $t_{elapsed} > t_{TH}$.

Figure 8:
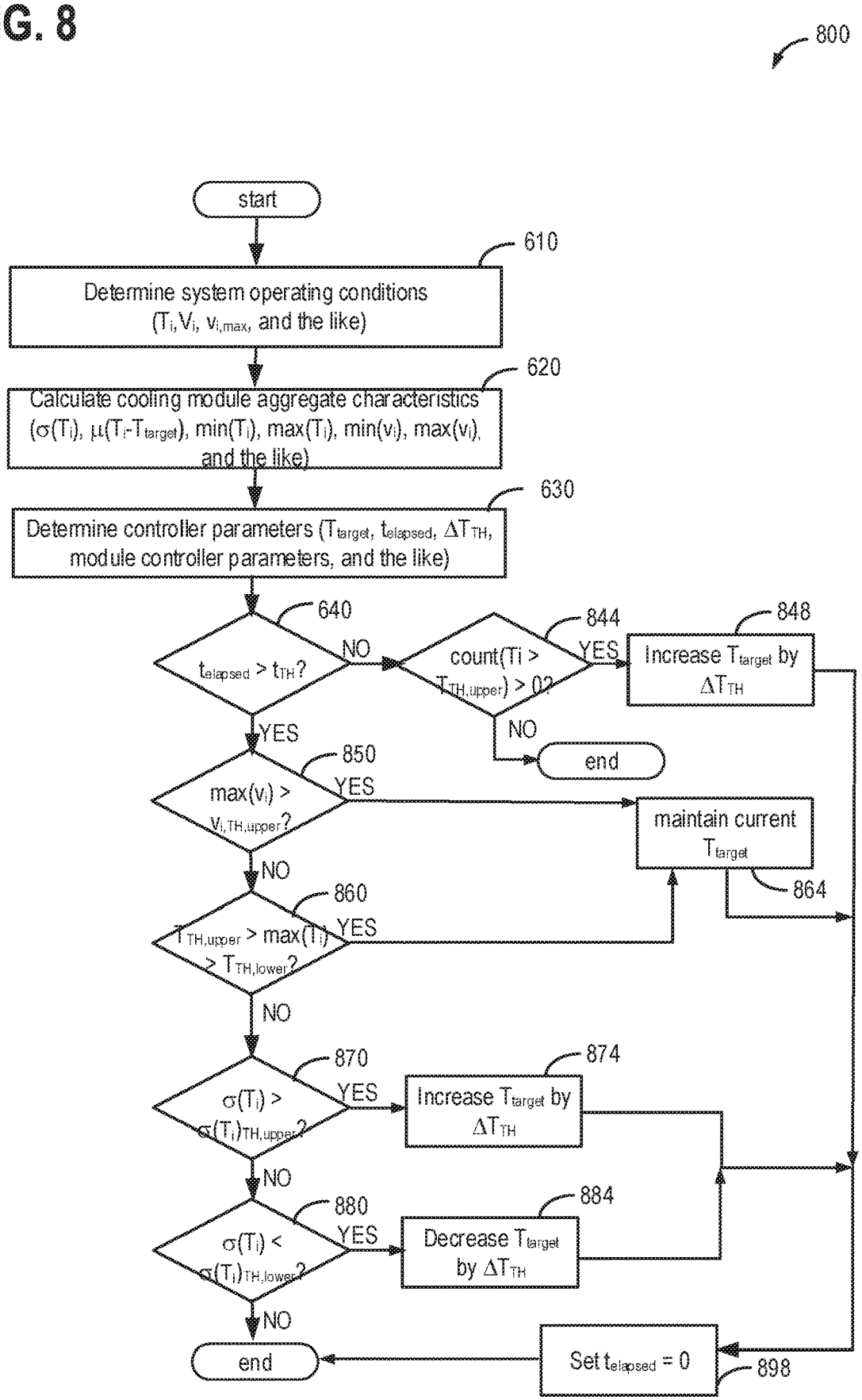

Turning now to FIG. 8, it illustrates a flow chart for an example embodiment method 800 of the generalized method 600 of operating a lighting device 400. Method 800 may be include executable instructions residing on board non-transitory memory of control system 414. Method 800 begins at steps 610, 620, 630, and 640, as described similarly for method 600 above. As shown in FIG. 8, the control system 414 evaluates a single aggregate characteristic condition during the condition when $t_{elapsed} < t_{TH}$, and evaluates up to four aggregate characteristic conditions when $t_{elapsed} > t_{TH}$.

At 640, for the case where $t_{elapsed}$ is not greater than $t_{TH}$, method 800 continues to 844 where it determines if count $(T_i > T_{TH,upper}) > 0$, as per row 1 of Table 720. Responsive to count$(T_i > T_{TH,upper}) > 0$, method 800 continues at 848 where the master controller 314 increases $T_{target}$ by $\Delta T_{TH}$. As per the control diagram 300, $T_{target,adj}$ (e.g., $T_{target}$ increased by $\Delta T_{TH}$) is then output as the set points for each of the discrete cooling module controllers 214. The cooling module controllers 214 then adjust the speed of the corresponding cooling fan 120 to achieve $T_{target,adj}$. Returning to method 800 at 844 for the case where count$(T_i > T_{TH,upper})$ is not greater than 0, method 800 ends.

Returning to method 800 at 640 for the case where $t_{elapsed} > t_{TH}$, method 800 continues at 850 where the master controller 314 determines if max$(V_i) > V_{TH,upper}$. For the case where max$(V_i) > V_{TH,upper}$, method 800 continues at 864 where master controller 314 maintains the current $T_{target}$. As described above with reference to FIG. 7, during the condition where max$(V_i) > V_{TH,upper}$, the cooling capacity (e.g., in this case, the cooling fan speed) of one or more cooling modules may not be substantially increased; as such, the master controller maintains $T_{target}$ at the current value. Responsive to one or more cooling fan speeds being greater than $V_{TH,upper}$, the master controller 314 maintains $T_{target}$ at the current value, recognizing that the cooling subsystem, in its current configuration, has approached a thermal steady-state as additional cooling capacity may not be substantially available.

Returning to 850 for the case where max$(V_i)$ is not greater than $V_{TH,upper}$, method 800 continues at 860 where the master controller 314 determines if $T_{TH,upper} > \max(T_i) > T_{TH,lower}$. As described above with reference to FIG. 7, $T_{TH,lower}$ may correspond to a heat sink temperature above which further decreasing $T_{target}$ may lead to a heat sink temperature approaching $T_{TH,upper}$, increasing a risk of burnout and/or degradation of one or more light-emitting elements. As such, in response to $T_{TH,upper} > \max(T_i) > T_{TH,lower}$, method 800 continues at 864 where master controller 314 may maintain $T_{target}$ at its current value.

Returning to 860 for the case where max$(T_i)$ is not less than $T_{TH,upper}$ and where max$(T_i)$ is not greater than $T_{TH,lower}$, method 800 continues at 870 where master controller 314 determines if $\sigma(T_i) > \sigma(T_i)_{TH,upper}$. For the case where $\sigma(T_i) > \sigma(T_i)_{TH,upper}$, method 800 continues at 874 where the master controller 314 increases $T_{target}$ by $\Delta T_{TH}$. For the case where $\sigma(T_i)$ is not greater than $\sigma(T_i)_{TH,upper}$, method 800 continues at 880 where the master controller 314 determines if $\sigma(T_i) < \sigma(T_i)_{TH,lower}$. For the case where $\sigma(T_i) < (T_i)_{TH,lower}$, method 800 continues at 884 where the master controller 314 decreases $T_{target}$ by $\Delta T_{TH}$. For the case where $\sigma(T_i)$ is not less than $\sigma(T_i)_{TH,lower}$, method 800 ends. After executing control actions at 848, 864, 874, and 884, method 800 continues to 898 where the master controller 314 resets $t_{elapsed}$ to 0, prior to ending.

In this manner, one embodiment a method of operating a lighting device includes an array of light-emitting elements, an array of heat sinks, and an array of cooling fans, wherein each of the heat sinks corresponds to one of the light-emitting elements, and each of the cooling fans corresponds to one of the heat sinks, the method comprising, conductively coupling each of the heat sinks to the corresponding light-emitting element, directing air flow from each of the cooling fans to the corresponding heat sink, measuring heat sink temperatures corresponding to each of the heat sinks by way of a temperature sensor positioned at each of the heat sinks, adjusting a speed of each of the cooling fans to reduce a deviation of the corresponding heat sink temperature from a target temperature, and adjusting the target temperature based on an aggregate characteristic of the cooling fan speeds. A first example of the method further includes adjusting the target temperature based on an aggregate characteristic of the heat sink temperatures. A second example of the method optionally including the first example, further includes wherein adjusting the target temperature based on an aggregate characteristic of the cooling fan speeds includes maintaining the target temperature when one of the cooling fan speeds exceeds an upper threshold cooling fan speed. A third example of the method optionally including one or more of the first and/or second examples, further includes wherein adjusting the target temperature based on an aggregate characteristic of the heat sink temperatures includes adjusting the target temperature based on an aggregate statistical characteristic of the heat sink temperatures. A fourth example of the method optionally including one or more of the first through third examples, further includes wherein adjusting the target temperature based on an aggregate characteristic of the heat sink temperatures includes decreasing the target temperature when a standard deviation of the heat sink temperatures is below a lower threshold standard deviation. A fifth example of the method optionally including one or more of the first through fourth examples, further includes wherein adjusting the target temperature based on an aggregate characteristic of the heat sink temperatures includes increasing the target temperature when one of the heat sink temperatures is above an upper threshold temperature. A sixth example of the method optionally including one or more of the first through fifth examples, further includes wherein adjusting the target temperature based on an aggregate characteristic of the heat sink temperatures includes maintaining the target temperature when one of the heat sink temperatures is above a lower threshold temperature.

In another representation, a method of operating a lighting device includes an array of radiation-emitting elements, an array of heat sinks, and an array of cooling fans, wherein each of the heat sinks corresponds to one of the light-emitting elements, and each of the cooling fans corresponds to one of the heat sinks, the method comprising, conductively coupling each of the heat sinks to the corresponding light-emitting element, directing air flow from each of the cooling fans to the corresponding heat sink, measuring heat sink temperatures corresponding to each of the heat sinks by way of a temperature sensor positioned at each of the heat sinks, adjusting a speed of each of the cooling fans to reduce a deviation of the corresponding heat sink temperature from a target temperature, and adjusting the target temperature based on an aggregate characteristic of the cooling fan speeds. A first example method further includes wherein the array radiation-emitting elements includes one or more of a transistor, power source, and a CPU processor. A second example of the method, optionally including the first example, further includes adjusting the target temperature based on an aggregate characteristic of the heat sink temperatures. A third example of the method, optionally including the first and/or second examples, further includes wherein adjusting the target temperature based on an aggregate characteristic of the heat sink temperatures includes increasing the target temperature when a standard deviation of the heat sink temperatures is greater than an upper threshold standard deviation.

In another embodiment, a method of operating a lighting device includes a plurality of lighting modules, each lighting module including a light-emitting element conductively coupled to a heat sink, a cooling fan directing air onto the heat sink, a temperature sensor indicating a temperature of the heat sink, and a controller, the method including, for each of the lighting modules, adjusting a speed of the cooling fan based on a deviation of the heat sink temperature from a target temperature by way of the controller, at a master controller conductively coupled to each of the lighting modules, adjusting the target temperature based on an aggregate characteristic of the lighting modules, and transmitting the target temperature to each of the controllers. A first example of the method further includes at the master controller, after adjusting the target temperature based on an aggregate characteristic of the lighting modules, and transmitting the target temperature to each of the controllers, readjusting the target temperature and transmitting the readjusted target temperature to each of the controllers after a threshold duration has elapsed. A second example of the method, optionally including the first example, further includes at the master controller, after adjusting the target temperature based on an aggregate characteristic of the lighting modules, and transmitting the target temperature to each of the controllers, readjusting the target temperature and transmitting the readjusted target temperature to each of the controllers prior to a threshold duration elapsing only when the heat sink temperature of one of the lighting modules is greater than an upper threshold temperature. A third example of the method, optionally including the one or more of the first and/or second examples, further includes increasing the threshold duration when a difference between the upper threshold temperature and the target temperature is larger and decreasing the threshold duration when the difference between the upper threshold temperature and the target temperature is smaller. A fourth example of the method, optionally including one or more of the first through third examples, further includes positioning the plurality of lighting modules asymmetrically relative to an exhaust port of a housing of the lighting device. A fifth example of the method, optionally including one or more of the first through fourth examples, further includes discharging exhaust air from the cooling fans of each of the lighting modules out of the housing only by way of the exhaust port.

In another representation, a method of operating a lighting device includes a plurality of lighting modules, each lighting module including a radiation-emitting element conductively coupled to a heat sink, a cooling fan directing air onto the heat sink, a temperature sensor indicating a temperature of the heat sink, and a controller, the method including, for each of the lighting modules, adjusting a speed of the cooling fan based on a deviation of the heat sink temperature from a target temperature by way of the controller, at a master controller conductively coupled to each of the lighting modules, adjusting the target temperature based on an aggregate characteristic of the lighting modules, and transmitting the target temperature to each of the controllers. A first example method further includes wherein the array radiation-emitting elements includes one or more of a transistor, power source, and a CPU processor.

The systems and methods described herein may be implemented as retrofits to existing lighting modules, whereby a master controller 314 and/or one or more cooling module controllers 214 may be configured to control cooling modules for an existing lighting device. In some cases pre-existing temperature sensors may be utilized; however, in other cases, lighting devices may be modified to allow for individual discrete cooling module control corresponding with individual heat sink temperature monitoring. As described herein, the control methods and systems may be adaptive to real-time process changes which can affect heat transfer and/or heat generation characteristics of the lighting device. For example, as light-emitting elements for a lighting module degrade with usage, the cooling demand for that lighting module may decrease as power consumed decreases. As such, the cooling fan speed for that lighting module may be reduced while still achieving $T_{target}$. The reduction in $V_i$ for that particular cooling module can impact aggregate characteristics related to $V_i$, to which the methods and systems described herein can respond accordingly. As another example, the control methods and systems herein may be adaptive to an introduction of a new heat source or in proximity or at the lighting device, especially when the new heat source asymmetrically impacts each module of the lighting module array. As another example, the control methods and systems herein may be adaptive changes in the cooling air flow environment at the lighting device, such as removal or addition of exhaust ports, adjusting a size of the exhaust port, addition or removal of cooling fans, and the like.

As another example, if a lighting device, including the cooling modules, lighting modules, housing and exhaust port configuration, and the like are well-characterized and determined to be relatively static (e.g, a new system), an off-line factory calibration may be carried out to pre-determine an optimal $T_{target}$, $t_{TH}$, and $\Delta T_{TH}$, given the cooling capacities and cooling demands for each lighting module. Following the factory calibration, the control-optimized lighting device may be dropped into a manufacturing process environment with pre-determined control parameters.

In this manner, an embodiment of a lighting system includes a plurality of lighting modules, each lighting module including a light-emitting element conductively coupled to a heat sink, a cooling fan directing air onto the heat sink, a temperature sensor indicating a temperature of the heat sink, and a controller for adjusting a speed of the cooling fan based on a deviation of the heat sink temperature from a target temperature, and a master controller, conductively coupled to the plurality of lighting modules, including executable instructions residing in non-transitory memory to, calculate the target temperature based on an aggregate characteristic of the lighting modules, and transmit the target temperature to each of the controllers. A first example of the lighting system further includes a housing including only one air exhaust port, wherein each of the plurality of lighting modules is mounted at the housing, and discharge air from each of the cooling fans exits the housing through the air exhaust port after fluidly contacting the heat sink of the corresponding lighting module. A second example of the lighting system optionally including the first example, further includes wherein at least one of a plurality of heat transfer characteristics of one of the lighting modules is unequal to the corresponding heat transfer characteristic of another lighting module, and the plurality of heat transfer characteristics includes a discharge air flow path length between a cooling fan and the air exhaust port, a light-emitting element power, and a heat sink heat capacity. A third example of the lighting system optionally including one or more of the first and/or second examples, further includes wherein the executable instructions to determine the target temperature based on the aggregate characteristic of the lighting modules includes reducing the target temperature by a threshold temperature difference when the speed of all of the cooling fans of the lighting modules is less than an upper threshold speed. A fourth example of the lighting system optionally including one or more of the first through third examples, further includes wherein the executable instructions to determine the target temperature based on the aggregate characteristic of the lighting modules includes maintaining the target temperature when the speed of one of the cooling fans of the lighting modules is greater than the upper threshold speed. A fifth example of the lighting system optionally including one or more of the first through fourth examples, further includes wherein the executable instructions include increasing the threshold temperature difference in response to a mean deviation of the heat sink temperatures from the target temperature being greater than an upper threshold mean deviation. A sixth example of the lighting system optionally including one or more of the first through fifth examples, further includes wherein the executable instructions to determine the target temperature based on the aggregate characteristic of the lighting modules includes increasing the target temperature when a mean cooling fan speed is greater than an upper threshold mean cooling fan speed.

In another representation, a lighting system includes a plurality of lighting modules, each lighting module including a radiation-emitting element conductively coupled to a heat sink, a cooling fan directing air onto the heat sink, a temperature sensor indicating a temperature of the heat sink, and a controller for adjusting a speed of the cooling fan based on a deviation of the heat sink temperature from a target temperature, and a master controller, conductively coupled to the plurality of lighting modules, including executable instructions residing in non-transitory memory to, calculate the target temperature based on an aggregate characteristic of the lighting modules, and transmit the target temperature to each of the controllers. A first example of the lighting system further includes wherein the radiation-emitting element includes one or more of a power source, a transistor, and a CPU processor.

Note that the example control and estimation routines included herein can be used with various lighting sources and lighting system configurations. The control methods and routines disclosed herein may be stored as executable instructions on-board a controller in non-transitory memory. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations and/or functions may be repeatedly performed depending on the particular strategy being used. Further, the described actions, operations and/or functions may graphically represent code to be programmed into non-transitory memory of the computer readable storage medium in the lighting device control system.

It will be appreciated that the configurations and routines disclosed herein are exemplary in nature, and that these specific embodiments are not to be considered in a limiting sense, because numerous variations are possible. For example, the above technology can be applied to various Lambertian or near-Lambertian light sources. The subject matter of the present disclosure includes all novel and non-obvious combinations and sub-combinations of the various systems and configurations, and other features, functions, and/or properties disclosed herein.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method of operating a lighting device including an array of light-emitting elements, an array of heat sinks, and an array of cooling fans, wherein each of the heat sinks corresponds to one of the light-emitting elements, and each of the cooling fans corresponds to one of the heat sinks, the method comprising:
conductively coupling each of the heat sinks to the corresponding light-emitting element,
directing air flow from each of the cooling fans to the corresponding heat sink,
measuring heat sink temperatures corresponding to each of the heat sinks by way of a temperature sensor positioned at each of the heat sinks,
adjusting a speed of each of the cooling fans to reduce a deviation of the corresponding heat sink temperature from a target temperature, and
adjusting the target temperature based on an aggregate characteristic of the cooling fan speeds.

2. The method of claim 1, further comprising adjusting the target temperature based on an aggregate characteristic of the heat sink temperatures.

3. The method of claim 2, wherein adjusting the target temperature based on an aggregate characteristic of the heat sink temperatures includes adjusting the target temperature based on an aggregate statistical characteristic of the heat sink temperatures.

4. The method of claim 2 wherein adjusting the target temperature based on an aggregate characteristic of the heat sink temperatures includes decreasing the target temperature when a standard deviation of the heat sink temperatures is below a lower threshold standard deviation.

5. The method of claim 2 wherein adjusting the target temperature based on an aggregate characteristic of the heat sink temperatures includes increasing the target temperature when one of the heat sink temperatures is above an upper threshold temperature.

6. The method of claim 2 wherein adjusting the target temperature based on an aggregate characteristic of the heat sink temperatures includes maintaining the target temperature when one of the heat sink temperatures is above a lower threshold temperature.

7. The method of claim 1, wherein adjusting the target temperature based on an aggregate characteristic of the cooling fan speeds includes maintaining the target temperature when one of the cooling fan speeds exceeds an upper threshold cooling fan speed.

8. A lighting system, comprising:
a plurality of lighting modules, each lighting module including a light-emitting element conductively coupled to a heat sink, a cooling fan directing air onto the heat sink, a temperature sensor indicating a temperature of the heat sink, and a controller for adjusting a speed of the cooling fan based on a deviation of the heat sink temperature from a target temperature, and
a master controller, conductively coupled to the plurality of lighting modules, including executable instructions residing in non-transitory memory to, calculate the target temperature based on an aggregate characteristic of the lighting modules, and transmit the target temperature to each of the controllers.

9. The lighting system of claim 8, further comprising a housing including only one air exhaust port, wherein each of the plurality of lighting modules is mounted at the housing, and discharge air from each of the cooling fans exits the housing through the air exhaust port after fluidly contacting the heat sink of the corresponding lighting module.

10. The lighting system of claim 8, wherein
at least one of a plurality of heat transfer characteristics of one of the lighting modules is unequal to the corresponding heat transfer characteristic of another lighting module, and
the plurality of heat transfer characteristics includes a discharge air flow path length between a cooling fan and the air exhaust port, a light-emitting element power, and a heat sink heat capacity.

11. The lighting system of claim 8, wherein the executable instructions to determine the target temperature based on the aggregate characteristic of the lighting modules includes reducing the target temperature by a threshold temperature difference when the speed of all of the cooling fans of the lighting modules is less than an upper threshold speed.

12. The lighting system of claim 11, wherein the executable instructions to determine the target temperature based on the aggregate characteristic of the lighting modules includes maintaining the target temperature when the speed of one of the cooling fans of the lighting modules is greater than the upper threshold speed.

13. The lighting system of claim 11, wherein the executable instructions include increasing the threshold temperature difference in response to a mean deviation of the heat sink temperatures from the target temperature being greater than an upper threshold mean deviation.

14. The lighting system of claim 13, wherein the executable instructions to determine the target temperature based on the aggregate characteristic of the lighting modules includes increasing the target temperature when a mean cooling fan speed is greater than an upper threshold mean cooling fan speed.

15. A method of operating a lighting device including a plurality of lighting modules, each lighting module including a light-emitting element conductively coupled to a heat sink, a cooling fan directing air onto the heat sink, a temperature sensor indicating a temperature of the heat sink, and a controller, the method comprising:
for each of the lighting modules, adjusting a speed of the cooling fan based on a deviation of the heat sink temperature from a target temperature by way of the controller,
at a master controller conductively coupled to each of the lighting modules, adjusting the target temperature based on an aggregate characteristic of the lighting modules, and transmitting the target temperature to each of the controllers.

16. The method of claim 15, further comprising, at the master controller, after adjusting the target temperature based on an aggregate characteristic of the lighting modules, and transmitting the target temperature to each of the controllers, readjusting the target temperature and transmitting the readjusted target temperature to each of the controllers after a threshold duration has elapsed.

17. The method of claim 16, further comprising, at the master controller, after adjusting the target temperature based on an aggregate characteristic of the lighting modules, and transmitting the target temperature to each of the controllers, readjusting the target temperature and transmitting the readjusted target temperature to each of the controllers prior to a threshold duration elapsing only when the heat sink temperature of one of the lighting modules is greater than an upper threshold temperature.

18. The method of claim 16, further comprising increasing the threshold duration when a difference between the upper threshold temperature and the target temperature is larger and decreasing the threshold duration when the difference between the upper threshold temperature and the target temperature is smaller.

19. The method of claim 15, further comprising positioning the plurality of lighting modules asymmetrically relative to an exhaust port of a housing of the lighting device.

20. The method of claim 19, further comprising discharging exhaust air from the cooling fans of each of the lighting modules out of the housing only by way of the exhaust port.

* * * * *